United States Patent [19]

Emmons

[11] Patent Number: 4,588,969
[45] Date of Patent: May 13, 1986

[54] ADJUSTABLE CRYSTAL OSCILLATOR WITH ACCELERATION COMPENSATION

[75] Inventor: Donald A. Emmons, Carlisle, Mass.

[73] Assignee: Frequency and Time Systems, Inc., Beverly, Mass.

[21] Appl. No.: 641,696

[22] Filed: Aug. 17, 1984

[51] Int. Cl.$^4$ .............................................. H03B 5/32
[52] U.S. Cl. .................................... 331/158; 331/175
[58] Field of Search ...................... 331/65, 116 R, 158, 331/175; 361/278, 280

[56] References Cited

U.S. PATENT DOCUMENTS 4,100,512 7/1978 Valdois et al. ...................... 331/158

Primary Examiner—Eugene LaRoche
Assistant Examiner—G. Wan
Attorney, Agent, or Firm—Peter L. Berger

[57] ABSTRACT

A variable oscillator is disclosed which is adjustable by a user to a desired frequency. A variable reactance element is inserted in series with a crystal resonator, the variable reactance element having characteristics which are dependent upon the conditions of acceleration. The characteristics of the element which is a compensator are substantially complementary to the characteristics of the crystal resonator to balance out said variation of the crystal resonator during conditions of acceleration. There is also provided a variable reactance network connected to the oscillator to adjust the operating frequency of said oscillator.

13 Claims, 4 Drawing Figures

ADJUSTABLE CRYSTAL OSCILLATOR WITH ACCELERATION COMPENSATION

BACKGROUND OF THE INVENTION

This invention relates to compensating crystal oscillators for changes which occur to the crystal oscillators due to acceleration.

Crystal oscillators are widely employed in a variety of vehicles which are subject to extreme g-conditions. Due to the importance of the accuracy of the oscillator output, compensation schemes have been proposed which compensate for changes which occur to the oscillator under acceleration, both static (such as constant gravity) and dynamic (vibration).

U.S. Pat. No. 4,100,512 entitled "Crystal Oscilator Compensated Against Frequency Shift Due to Acceleration", issued on July 11, 1978 having as inventors Michel Valdois and Armand B. Dupuy discloses a crystal oscillator which is compensated for by utilizing an adjusting capacitance having at least one variable capacitor, such that the frequency shift in the resonator caused by g-effects is compensated by the frequency shift of the variable capacitor. The Valdois patent provides a complete description of the effects of acceleration upon crystal oscillator circuits, and the presentation in that patent is referenced as background material for the present invention.

The crystal oscillator described in the Valdois patent does not permit independent adjustment of the oscillator frequency without at the same time, unavoidably changing the degree of compensation of the complete network circuits. The oscillator may be provided with exact g-force compensation at its set frequency, but there is no ability to adjust it to a user's specific frequency requirement, without having an adverse effect on the desired acceleration immunity.

The applicant in the present invention authored an article entitled "Acceleration Sensitivity Compensation in High Performance Crystal Oscillators" which was presented at the Tenth Annual Precise Time and Time Interval (PTTI) Applications and Planning Meeting, November, 1978. This paper also presents excellent background material relating to the variations encountered in high performance crystal oscillators under acceleration conditions.

In this paper, several compensation schemes are identified in the first column of page 3 as well as on page 4. Although this article suggests that the compensator coefficient depends upon oscillator tuning, there is no presentation of an effective adjustable oscillator having complete acceleration compensation for each and every setting of the frequency tuning.

Sometimes it is desired that the user adjust the basic oscillator frequency as determined by the crystal resonator in order to adapt the oscillator to specific user needs. This might be encountered where the oscillator is used in a phaselock loop circuit or in other circuits in which tunable frequencies are required. One way of adjusting the crystal oscillator is to employ a variable reactance network in the resonator circuit. The variable reactance network may be adjusted to alter the basic frequency of the oscillator. An adjustment of a variable reactance network in the crystal resonator circuit also causes a shift in the static reactive value, so that conditions of network reactance which previously afforded the correct sensitivity for the acceleration-compensation element, now no longer are correct for exact compensation.

An object of this invention is to provide an adjustable reactance network which can exactly compensate for acceleration variations of a crystal resonator for all conditions of static reactance load which result from the necessity to adjust the frequency of the oscillator.

Another object of this invention is to provide such a compensating network which also minimizes centripetal rotational effects by packaging the elements of the apparatus accordingly.

Yet another object of this invention is to provide reactance compensation for second order and stray capacitance effects.

Another object of this invention is to provide such a compensating network employing a variable or selectable reactance which may be easily adjusted to provide a reactance null at zero effective acceleration while compensating for the acceleration sensitivity of the crystal oscillator.

Other objects, advantages and features of this invention will become more apparent from the following description.

SUMMARY OF THE INVENTION

In accordance with the principles of this invention, the above objects are accomplished by providing a variable reactance network in series with a crystal resonator to adjust the frequency of the oscillator network. A compensating network is employed which comprises a variable reactance element having characteristics which are dependent upon acceleration, the characteristics of the variable reactance element being substantially complementary to the acceleration characteristics of the crystal resonator. The variable reactance further comprises an inductive element which reactively balances with the variable capacitor at conditions of no acceleration. Thus the compensation part of the network is transparent to the variable reactance network employed to adjust the underlying crystal oscillator frequency.

In accordance with the principles of this invention, the variable reactance network may comprise a varactor or other variable reactance network to adjust the frequency of the crystal oscillator. The inductive element which is used to balance the capacitive reactance of the acceleration compensation element when the variable reactance network is employed to adjust the underlying oscillator frequency may easily be adjusted to achieve desired null and g-force balancing in order to enhance the sensitivity and accuracy of the oscillator.

The variable capacitor and chosen inductor form an acceleration sensitive variable reactance network, and the elements of the variable reactance unit are mounted in close proximity to the crystal resonator to minimize rotational sensitivity of the crystal oscillator. This is necessary because centripetal accelerations (from rotational motion) produce frequency shifts in resonator and compensator which do not cancel each other but which add to give twice the effect of the resonator alone.

The invention further comprises the crystal resonator of the crystal oscillator including an inductive element which is resonant at the operating frequency of the oscillator with the electrode and lead capacitance of the resonator. This reduces to a second order effect the interraction between frequency tuning by the user and the required sensitivity factor of the acceleration-dependent variable reactance.

DETAILED DESCRIPTION

In the prior art as described above a variable reactance element is inserted in series with the crystal resonator and as the resonator varies its frequency output in response to the g-force, the variable reactance element (the compensator) will also vary to compensate for this acceleration variation of the resonator. The crystal oscillator frequency may not necessarily be set at that desired by the user. In order to adjust the oscillator frequency, a variable reactance in addition to the compensator, is employed to tune the oscillator; that is, it may be adjusted to achieve the desired user frequency. In this arrangement, the variable tuning reactance interacts with the compensator and resonator parts of the circuit in a way which adversely changes the effective coefficient of compensation. The effective coefficient must remain constant under all conditions in order to provide exact compensation action. The instant invention provides this improvement over current practice.

Figure 1:
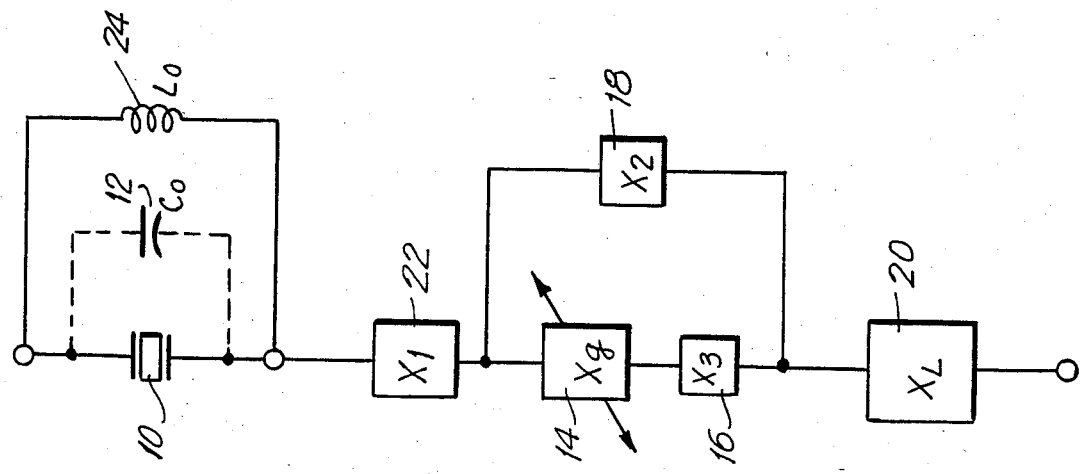
FIG. 1 is a block diagram of the crystal oscillator and variable reactance network of this invention.

FIG. 1 illustrates a block diagram of the present invention in which the crystal 10 is shown with a stray capacitance $C_0$ 12 shown in dotted lines. The crystal resonator is connected to a variable reactance network $X_g$ 14, that network comprising the standard variable reactance. In conventional circuitry and as illustrated by the prior art set forth in this application, $X_g$ is provided with acceleration characteristics compensating for those of the crystal, so that the crystal variation due to acceleration will be eliminated.

A reactance $X_3$ 16 is connected in series with variable reactance 14, and a reactance $X_2$ 18 is connected across the series connection of reactances 14 and 16. Reactances 16 and 18, otherwise designated as $X_3$ and $X_2$ are employed to enhance the sensitivity adjustment of reactance $X_g$ to make the acceleration characteristics of the variable reactance exactly complementary to that of the crystal resonator response.

In some cases, the user desires to adjust the frequency of the oscillator circuit, and to that end, a variable reactance network 20 is connected in series to reactance 16. This variable reactance 20 is known as the load reactance and is used to tune the crystal oscillator to the desired frequency. When the user makes this adjustment, there will be a shift in the static reactance of the overall oscillator circuit, and in accordance with the principles of this invention, a reactance 22 is added in series in the load circuit, preferably between reactance 14 and resonator circuit 10. Reactance 22 may be adjustable or fixed, and it is primarily to cancel the static reactance of $X_3$ at zero$_g$ such that it no longer interacts with the reactance shift occuring in the load circuit when reactance 20 adjusts the oscillator frequency.

In accordance with yet another feature of this invention, an inductor 24 otherwise designated as $L_o$ is placed across crystal 10 and stray capacitor 12 also designated as $C_o$. The value of $L_o$ is selected so that it is resonant with $C_o$ at the frequency of the crystal oscillator as set forth in the following formula.

$$f_o = \frac{1}{2\pi \sqrt{L_o C_o}}$$

Employing inductor 24 to balance the electrode and lead capacitance of the resonator further reduces the second order effect of the interaction between the frequency tuning by the user and the required sensitivity factor of the acceleration-dependent variable reactance.

Figure 2:
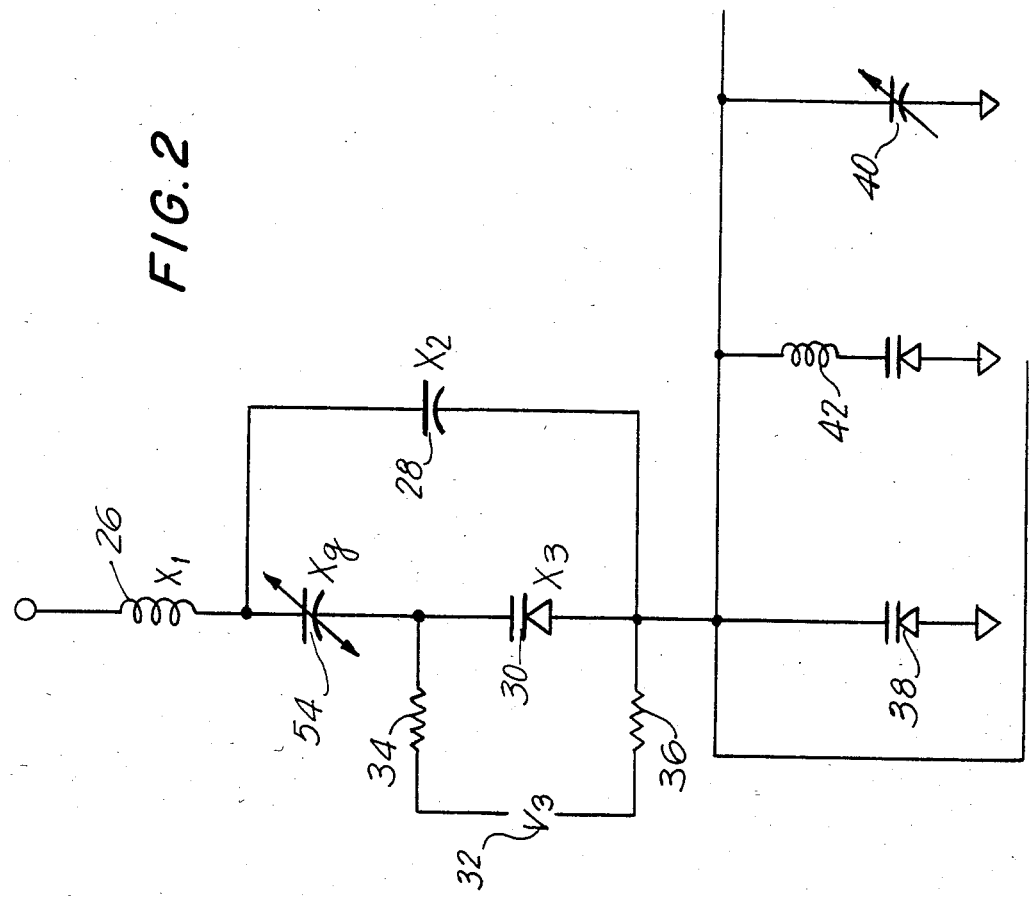
FIG. 2 is a schematic diagram of one embodiment of the present invention.

FIG. 2 illustrates a preferred embodiment of the present invention in which reactance 22 comprises an inductor 26. Variable reactance 14 is shown as a variable capacitor element 54, while reactance $X_2$ is also shown as a capacitive element 28. Reactance 16 is shown as a varactor 30 to which a voltage 32 is applied through resistors 34 and 36.

The user tuning reactance 20 may comprises a varactor such as that illustrated as 38, a variable capacitor 40 or an adjustable oscillator network 42. Each of the circuits 38, 40 and 42 may be employed by the user to load the oscillator circuit and adjust the oscillator frequency.

Figure 3:
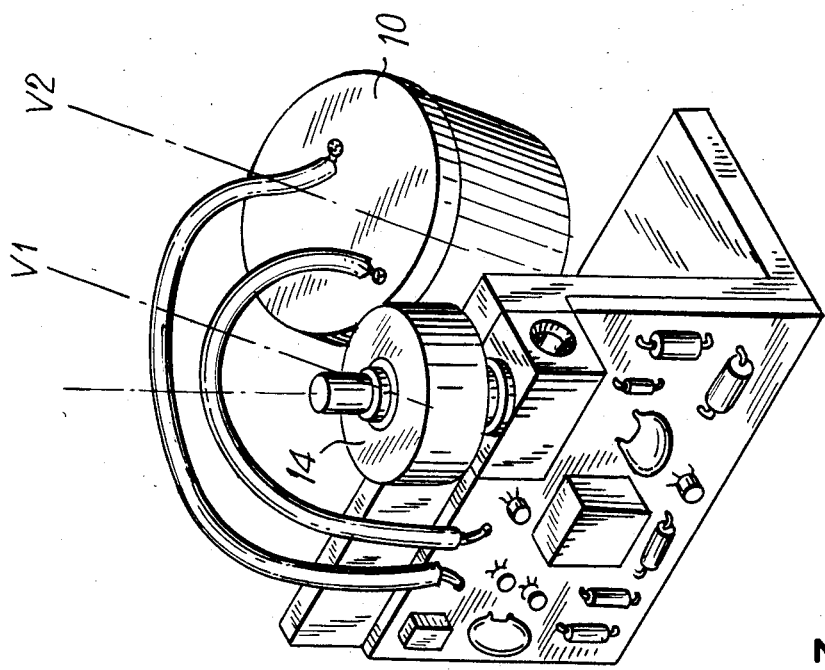
FIG. 3 is a perspective view of the variable reactance and crystal oscillator packaged to minimize rotational sensitivity of the crystal oscillator.

FIG. 3 is a perspective view of the assembly of the elements of the oscillator of this invention. In particular, there is shown the crystal oscillator 10 and the variable reactance 14. Note that the variable reactance is closely assembled to the oscillator, and these elements are placed as close as physically possible to avoid "centripetal force" components for which compensation will not be available.

The crystal oscillator and variable reactance each exhibit acceleration sensitivity vectors, $V_3$ and $V_1$, respectively, and the orientation of the oscillator and variable reactance elements in FIG. 3 are arranged so that the acceleration sensitivity vectors are parallel.

Figure 4:
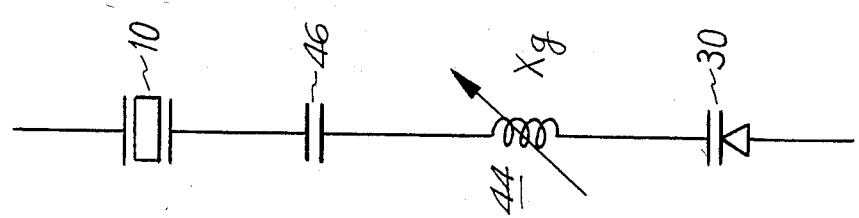
FIG. 4 is a schematic diagram of another embodiment of this invention.

FIG. 4 is a schematic diagram of another embodiment of this invention in which the variable reactance compensator $X_g$ 14 comprises an inductor 44 and the corresponding static reactance cancelling element $X_1$ 22 is capacitor 46. The variable resonator is designated as numeral 10 and is connected in series to capacitor 46 while varactor 30 is also connected in series to inductor 44. Numerals 10 and 30 are used in the figures to designate the same elements.

This invention has been described with a preferred embodiment, but other arrangements and modifications may be made by those skilled in the art without departing from the teachings of this invention.

What is claimed is:

1. A variable oscillator adjustable by a user to a desired frequency comprising apparatus for compensating for the variation of crystal resonator frequency under conditions of acceleration, said apparatus comprising a variable reactance element inserted in series with said crystal resonator, said variable reactance element comprising a compensator having characteristics which are dependent upon the conditions of acceleration, said characteristics of said compensator being substantially complementary to the characteristics of said crystal resonator to balance out said variations of said crystal resonator during conditions of acceleration, a variable reactance network connected to said oscillator to adjust the operating frequency of said oscillator, said variable reactance further comprising an inductive element.

2. A variable oscillator as claimed in claim 1, wherein the value of said inductive element is set to cancel the capacitive reactance of said compensator element to avoid adverse interaction when said variable reactance network is adjusted to change the operating frequency of said variable oscillator.

3. A variable oscillator as claimed in claim 1, wherein said variable reactance network comprises a varactor.

4. A variable oscillator as claimed in claim 2, wherein said variable reactance network comprises a varactor.

5. A variable oscillator as claimed in claim 1, wherein the variable reactance is formed as an integral unit of said compensator and said inductive element, wherein said integral unit is mounted in close proximity to said crystal resonator to minimize rotational sensitivity of said crystal oscillator.

6. A variable oscillator as claimed in claim 5, wherein said crystal resonator and said variable reactance each exhibit acceleration sensitivity vectors, wherein said acceleration sensitivity vectors are aligned to be parallel.

7. A variable oscillator as claimed in claim 1, wherein the crystal resonator of said crystal oscillator comprises an electrode and lead capacitance, further comprising an inductive element connected across said resonator crystal to be resonant with said electrode and lead capacitance at the operating frequency of said crystal.

8. A variable oscillator as claimed in claim 2, wherein the crystal resonator of said crystal oscillator comprises an electrode and lead capacitance, further comprising an inductive element connected across said resonator crystal to be resonant with said electrode and lead capacitance at the operating frequency of said crystal.

9. A variable oscillator as claimed in claim 1, wherein variable reactance compensator is an acceleration-sensitive inductor, and the corresponding static reactance cancelling element is a capacitor.

10. A variable oscillator as claimed in claim 1, wherein said variable reactance compensator is a variable capacitor.

11. A variable oscillator as claimed in claim 2, wherein said variable reactance compensator is a variable capacitor.

12. A variable oscillator as claimed in claim 3, wherein said variable reactance compensator is a variable capacitor.

13. A variable oscillator as claimed in claim 5, wherein said variable reactance compensator is a variable capacitor.

* * * * *